United States Patent [19]
Sawada

[11] Patent Number: 6,002,615
[45] Date of Patent: Dec. 14, 1999

[54] CLOCK SHIFT CIRCUIT AND SYNCHRONOUS SEMICONDUCTOR MEMORY DEVICE USING THE SAME

[75] Inventor: Seiji Sawada, Hyogo, Japan

[73] Assignee: Mitsubishi Denki Kabushiki Kaisha, Tokyo, Japan

[21] Appl. No.: 09/031,705

[22] Filed: Feb. 27, 1998

[30] Foreign Application Priority Data

Aug. 21, 1997 [JP] Japan .................................. 9-225217

[51] Int. Cl.$^6$ .................................................. G11C 13/00
[52] U.S. Cl. .................................. 365/189.01; 365/230.01
[58] Field of Search .......................... 365/189.01, 230.01, 365/233.5, 233

[56] References Cited

U.S. PATENT DOCUMENTS 5,479,374  12/1995  Kobayashi et al. .................. 365/233.5

FOREIGN PATENT DOCUMENTS 7-85663  3/1995  Japan .

Primary Examiner—Terrell W. Fears
Attorney, Agent, or Firm—McDermott, Will & Emery

[57] ABSTRACT

A mask control circuit for generating an internal mask designation signal for masking read data includes a shift circuit incorporating and shifting an applied signal in accordance with an internal column related clock signal CLKD for transmission and a reset means responsive to inactivation of a clock activation signal defining a generation period of the internal column clock signal for resetting the shift circuit in an initial state. An output from the shift circuit is changed from the initial state to another upon clock reapplication, so that the influence by an internal output signal from the shift circuit in the previous application is eliminated, thereby generating a correct internal mask designation signal. A clock shift circuit capable of reducing current consumption without accompanying any malfunction and a synchronous semiconductor memory device using the same is provided.

10 Claims, 11 Drawing Sheets

CLOCK SHIFT CIRCUIT AND SYNCHRONOUS SEMICONDUCTOR MEMORY DEVICE USING THE SAME

BACKGROUND OF THE INVENTION

1. Field of the Invention

The present invention relates to a shift circuit performing shift operation for sequentially shifting an applied signal in synchronization with a clock signal and a synchronous semiconductor memory device using the same, and more particularly to a shift circuit capable of reducing power consumption and a synchronous semiconductor memory device using the same.

2. Description of the Background Art

A shift circuit transferring an applied signal/data by shift operation in synchronization with a clock signal is used in various semiconductor devices. The shift circuit is used for example in a parallel/serial conversion circuit converting parallel data to serial data and in a delay circuit delaying a signal by a prescribed time.

Such a shift circuit is also used in a synchronous semiconductor memory device operating in synchronization with a clock signal in order to determine internal operation timing using the clock signal as a reference. The shift circuit used in the synchronous semiconductor memory device will now be described.

FIG. 13 schematically shows an overall arrangement of a conventional synchronous semiconductor memory device. Referring to FIG. 13, the synchronous semiconductor memory device includes: a memory cell array 1 having a plurality of memory cells arranged in a matrix of rows and columns; a row selection circuit 3 receiving an internal row address signal X applied from an address buffer 2 to drive the row in memory cell array 1 designated by the internal row address signal X; a column selection circuit 4 selecting, in accordance with an internal column address signal Y applied from address buffer 2, the column in memory cell array 1 designated by the column address signal Y; a sense amplifier sensing and amplifying data of a memory cell connected to a selected row in memory cell array 1; and an IO gate connecting the selected row in memory cell array 1 to an internal data bus in accordance with a column selection signal from a column selection circuit 4. The sense amplifier and the IO gate are shown in a single block 5 in FIG. 13.

Row selection circuit 3 includes a row address decoder for decoding the applied row address signal, and a word line drive circuit for driving the selected row in memory cell array 1 into a selected state in accordance with an output signal from the row address decoder. Column selection circuit 4 includes a column decoder decoding the applied internal column address signal Y to produce a column selection signal, and a burst address generator sequentially generating an internal column address signal in a prescribed sequence in synchronization with an internal clock signal CLK for transmission to the column decoder.

Address buffer 2 receives externally applied address signal bits A0 to An in synchronization with internal clock signal CLK to produce internal address signals X and Y.

The synchronous semiconductor memory device further includes an input/output circuit 6 for data input/output. Input/output circuit 6 generally includes: an input buffer receiving externally applied write data to generate internal write data; a write driver amplifying the internal write data from the input buffer for transmission to a selected memory cell; a preamplifier amplifying data read out from the selected memory cell; and an output buffer further performing buffering for the data from the preamplifier for external output.

The synchronous semiconductor memory device further includes: an input buffer circuit 7 receiving a control signal, that is, an external row address strobe signal extZRAS, an external column address strobe signal extZCAS and an external write enable signal extZWE externally applied in synchronization with internal clock signal CLK to generate an internal row address strobe signal RAS, an internal column address strobe signal CAS and internal write enable signal WE; a command decoder 8 determining the states of signals RAS, CAS and WE from input buffer circuit 7 and generating a signal for designating an operation mode in accordance with the determination result; a row related control circuit 9 activated in response to a row selection operation designation signal from command decoder 8, to perform control necessary for row selection operation; a column related control circuit 10 activated in response to a column selection operation designation signal from command decoder 8, to perform control necessary for column selection operation; and an input/output control circuit 11 driven in response to a data input/output operation designation signal from command decoder 8, to perform an operation necessary for data input/output.

Row related control circuit 9 controls activation/inactivation of row selection circuit 3, and also controls activation/inactivation of the sense amplifier included in block 5. Column related control circuit 10 controls operation of column selection circuit 4 and input/output control circuit 11 controls operation of an input/output circuit. Although not clearly shown in FIG. 13, address buffer 2 incorporates and latches an applied address signal in accordance with an address latch designation signal from row related control circuit 9 and column related control circuit 10 to produce internal row address signal X and internal column address signal Y.

The synchronous semiconductor memory device further includes: a clock input buffer 12 receiving an externally applied clock signal extCLK to produce an internal clock signal CLK; a clock generation circuit 13 enabled upon activation of a clock activation designation signal from row related control circuit 9, to produce a column related clock signal CLKD in accordance with internal clock signal CLK from clock input buffer 12; a DQM buffer 14 receiving an externally applied mask designation signal extDQM to produce a mask designation signal DQMIN in synchronization with internal clock signal CLK; and a mask control circuit 15 incorporating mask designation signal DQMIN in synchronization with internal clock signal CLK, to output internal mask designation signal DQMOT.

Clock generation circuit 13 is activated when row related control circuit 9 receives a row related selection operation designation signal for row selection operation from command decoder 8, as the application of the row related selection operation designation signal is followed by the application of a column selection operation designation signal for data writing/reading. Internal clock signal CLKD from clock generation circuit 13 is applied to column related control circuit 10 and input/output control circuit 11. Input/output control circuit 11 also receives internal mask designation signal DQMOT from mask control circuit 15.

FIG. 14 is a diagram showing an arrangement of the portion related to data reading of the synchronous semiconductor memory device shown in FIG. 13. In FIG. 14, an arrangement of command decoder 8, input/output control circuit 11, DQM buffer 14, mask control circuit 15 and input/output circuit 6 is shown.

Referring to FIG. 14, command decoder 8 includes a read command decoder 8a which receives negative logic signals /RAS, /CAS and /WE applied from an input buffer circuit 7 shown in FIG. 13, and determines that a read command of designating data reading is applied when these signals are set in prescribed states at the rising edge of internal clock signal CLK, to drive a data reading designation signal φr into an active state.

An operation mode instruction is applied in the form of a command in the synchronous semiconductor memory device. More specifically, the operation mode is designated in accordance with a combination of the states of signals /RAS, /CAS and /WE. The read command is applied when row address strobe signal /RAS is set to at H level and column address strobe signal /CAS and write enable signal /WE are both set at L level at the rising edge of internal clock signal CLK. Upon application of the read command, read command decoder 8a drives data read operation designation signal φr into the active state for a prescribed time in synchronization with internal clock signal CLK.

Input/output control circuit 11 includes: a read control circuit 11a activated in response to activation of read operation designation signal φr from read command decoder 8a, to operate in synchronization with a column related internal clock signal CLKD from clock generation circuit 13 shown in FIG. 13 to output a preamplifier activation signal PAE and a data output designation signal OEMF; a latency shifter 11b operating in synchronization with column related internal clock signal CLKD and delaying data output designation signal OEMF from read control circuit 11a by a prescribed period of time to output a data output activation signal OEM; and an output control circuit 11c outputting an output enable signal OEMD for enabling data output in accordance with internal mask designation signal DEMOT from mask control circuit 15 and data output activation signal OEM from latency shifter 11b.

Read control circuit 11a includes a counter and drives preamplifier activation signal PAE into the active state in synchronization with column related internal clock signal CLKD. The number of times of activation for preamplifier activation signal PAE is determined by the counter included in read control circuit 11a. The counter normally counts a burst length. Here, the burst length represents the number of data successively read or written when one access command (either a read command or a write command for designating reading/writing of data) is applied. The data output designation signal OEMF is also driven into the active state in accordance with activation of read operation designation signal φr for the period of the burst length.

Latency shifter 11b normally delays data output designation signal OEMF by a period of CAS latency minus one clock cycle for output. Here, CAS latency represents the number of clock cycles required for external output of valid data upon application of the read command. Latency shifter 11b is normally structured with a shift circuit, and shifts data output designation signal OEMF in accordance with column related internal clock signal CLKD to output data output activation signal OEM.

Output control circuit 11c sets output enable signal OEMD in the inactive state when internal mask designation signal DQMOT is designating mask for the read out data, and outputs internal enable signal OEMD in accordance with data output activation signal OEM when internal mask designation signal DQMOT is in the inactive state and not designating mask for the read out data.

Input/output circuit 6 includes a preamplifier 6a activated in response to activation of preamplifier activation signal PAE from read control circuit 11a, for amplifying the data of the selected memory cell in memory cell array 1 and an output buffer 6b for buffering the data applied from preamplifier 6a upon activation of output enable signal OEMD for external output. Output buffer 6b is brought into an output high impedance state upon inactivation of output enable signal OEMD.

A mask control circuit 15, whose structure will be later described in detail, delays mask designation signal DQMIN applied from a DQM buffer 14 by shift operation in synchronization with internal clock signal CLK to output internal mask designation signal DQMOT. The operation of the synchronous semiconductor memory device shown in FIGS. 13 and 14 during data reading will now be described with reference to a timing chart shown in FIG. 15.

In a clock cycle #1, at the rising edge of external clock signal extCLK, row address strobe signal /RAS is set at L level and column address strobe signal /CAS and write enable signal /WE are set at H level to apply an active command. Row related control circuit 9 shown in FIG. 13 is activated in accordance with the active command, and row selection circuit 3 performs row selection operation in accordance with internal row address signal X from address buffer 2 to drive a word line, corresponding to the row whose address has been designated, into a selected state. Row related control circuit 9 drives column related clock activation signal ENA into the active state in accordance with the active command. Column related clock activation signal ENA is driven into the active state in synchronization with the fall of internal clock signal CLK, and column related internal clock signal CLKD will be produced in clock cycles starting at next clock cycle #2.

The operation of these circuits are enabled by the production of column related internal clock signal CLKD to be applied to column related control circuit 10 and input/output control circuit 11 shown in FIG. 13.

In clock cycle #2, at the rising edge of external clock signal extCLK, row address strobe signal /RAS and write enable signal /WE are set at H level and column address strobe signal /CAS is set at L level to apply a read command. Column related control circuit 10 shown in FIG. 13 is activated in accordance with the read command to have an internal address signal from address buffer 2 applied to column selection circuit 4 as internal column address signal Y and to activate column selection circuit 4 for performing column selection operation for memory cell array 1. In addition, read control circuit 11a shown in FIG. 14 is activated in response to activation of read operation designation signal φr from read command decoder 8a to activate preamplifier activation signal PAE to make preamplifier 6a perform amplification operation.

If CAS latency is now two, latency shifter 11b outputs data output designation signal OEMF applied from read control circuit 11a with one clock cycle delayed, so that data output activation signal OEM from latency shifter 11b is driven into the active state in a clock cycle #3, which is one clock cycle later than cloak cycle #2 in which the read command was applied.

The data amplified by preamplifier 6a is applied to an output buffer 6b, which in turn outputs the data from preamplifier 6a in clock cycle #3. Mask designation signal extDQM is in the inactive state at L level, internal mask designation signal DQMOT from mask control circuit 15 is at L level, and output enable signal OEMD from output control circuit 11c is driven into the active state in accordance with activation of data output activation signal OEM. This allows the reading of data from output buffer 6b in clock cycle #3. This initial data is brought into a defined state at the rising edge of external clock signal extCLK in a clock cycle #4.

Column selection circuit 4 (with reference to FIG. 13) selects a memory cell in every clock cycle in accordance with an address signal supplied from an internal burst address generator, for coupling to preamplifier 6a, from which the data from the selected memory cell is sequentially amplified to be applied to output buffer 6b.

In clock cycle #4, external mask designation signal extDQM is driven into the active state at H level at the rising edge of external clock signal extCLK. Responsively, mask designation signal DQMIN from DQM buffer 14 (with reference to FIG. 14) is brought into the active state at H level, and internal mask designation signal DQMOT from mask control circuit 15 is brought into the active state in a clock cycle #5 with one clock cycle delayed. Output control circuit 11c brings output enable signal OEMD into the inactive state at L level in accordance with activation of internal mask designation signal DQMOT. Thus, output buffer 6b is brought into the output high impedance state in clock cycle #5 to inhibit output of data.

External mask designation signal extDQM is in the active state only in clock cycle #4, and therefore internal mask designation signal DQMOT from mask control circuit 15 is again brought into the inactive state at L level in a next clock cycle #6, output enable signal OEMD is also again brought into the active state as data output activation signal OEM is in the active state, and output buffer 6b outputs the data applied from preamplifier 6a. The data output designation signal from read control circuit 11a is driven into the active state only for a period of four clock cycles as a burst length is four. Therefore, data output activation signal OEM from latency shifter 11b is also in the active state for a period of four clock cycles and brought into the inactive state at L level in a clock cycle #7, and responsively output enable signal OEMD is also brought into the inactive state at L level.

When the reading of all the necessary data is completed, in a clock cycle #8, row address strobe signal /RAS and write enable signal /WE are set at L level and column address strobe signal /CAS is set at H level to apply a precharge command for designating precharge for memory cell array 1. Thus, row related control circuit 9 drives column related clock activation signal ENA as well as row selection circuit 3 and the sense amplifier (with reference to FIG. 13) into the inactive state to bring memory cell array 1 back into a precharged state.

As described above, column related control circuit 10 and input/output control circuit 11 operate after the active command is applied and the memory cell array is brought into the active state (this is because data is written into/read out of the memory cell after a word line is selected). Thus, memory cell array 1 is activated and then column related internal clock signal CLKD is produced to be applied to these column related control circuit 10 and input/output control circuit 11 only for the period in which the column related circuits (column selection circuit 4 and input/output circuit 6) may operate, so as to reduce current consumption in these circuits.

The output data, which appears two clock cycles after external mask designation signal extDQM was applied, is masked. Even when external clock signal extCLK is in a high speed, it is ensured that the read out data has a sufficient time to be masked internally. The use of mask designation signal extDQM allows an external processor to read out only the data necessary for the processing, so that the need for selecting unwanted data in the internal portion of the processor is eliminated, thereby simplifying the processing operation.

FIG. 16A is a diagram showing an example of a structure of DQM buffer 14 shown in FIGS. 13 and 14. Referring to FIG. 16A, DQM buffer 14 includes: a transfer gate 14a formed of an n channel MOS transistor which is made conductive when an inversion clock signal /CLK of internal clock signal CLK is at H level, and allows passage of externally applied mask designation signal extDQM; cascaded two stage inverters 14b and 14c receiving the mask designation signal from transfer gate 14a; an inverter 14d forming a latch circuit with inverter 14b; and an AND circuit 14e receiving internal clock signal CLK and an output signal from inverter 14c to output mask designation signal DQMIN. Inverter 14d inverts an output signal from inverter 14b for transmission to the input of inverter 14b.

The operation of DQM buffer 14 shown in the FIG. 16A will now be described with reference to a timing chart shown in FIG. 16B.

Transfer gate 14a becomes conductive when internal clock signal CLK is at L level and passes externally applied mask designation signal extDQM. On the other hand, the transfer gate 14a becomes nonconductive when internal clock signal CLK is at H level, and external mask designation signal extDQM, applied when internal clock signal CLK is at L level, is latched by inverters 14b and 14d.

Now in a clock cycle #a, if external mask designation signal extDQM is set at H level, transfer gate 14a becomes conductive when internal clock signal CLK is at L level, and external mask designation signal extDQM at H Level is transmitted to inverter 14b to be latched by inverters 14b and 14d. In this state, internal clock signal CLK and mask designation signal DQMIN are both at L level.

When internal clock signal CLK rises to H level, transfer gate 14a becomes nonconductive and the external mask designation signal at H level is latched by inverters 14b and 14d. AND circuit 14e is enabled in synchronization with the rise of internal clock signal CLK, and raises mask designation signal DQMIN to H level in accordance with the signal at H level applied from inverter 14c. When internal clock signal CLK falls to L level, the mask designation signal from AND circuit 14e also falls; to L level.

Thus, external mask designation signal extDQM can be incorporated or latched in synchronization with internal clock signal CLK to produce mask designation signal DQMIN in synchronization with internal clock signal CLK.

FIG. 17A is a diagram exemplifying a structure of mask control circuit 15 shown in FIGS. 13 and 14. Referring to FIG. 17A, mask control circuit 15 includes cascaded three stage shift circuits 15a, 15b and 15c each delaying an applied signal by a half clock cycle of internal clock signal CLK for output. Shift circuit 15c has the same structure as that of shift circuit 15a, and is shown only in a block in FIG. 17A. Internal mask designation signal DQMOT is output from shift circuit 15c.

Shift circuit 15a includes: an NAND circuit 15aa receiving mask designation signal DQMIN and internal clock signal CLK; an NAND circuit 15ab receiving mask designation signal DQMIN supplied through inverter 15e and internal clock signal CLK; an NAND circuit 15ac receiving an output signal from NAND circuit 15aa at one input; and an NAND circuit 15*ad* receiving an output signal from NAND circuit 15*ab* at one input. An output signal from NAND circuit 15*ad* is applied to the other input of NAND circuit 15*ac*, while an output signal DQMO from NAND circuit 15*ac* is applied to the other input of NAND circuit 15*ad*. NAND circuits 15*aa* and 15*ab* each function as a transfer gate which is made conductive when internal clock signal CLK is at H level, and NAND circuits 15*ac* and 15*ad* constitute a latch circuit for latching an applied data signal.

Shift circuit 15*b* includes: an NAND circuit 15*ab* receiving internal clock signal /CLK and an output signal from NAND circuit 15*ac*; an NAND circuit 15*bb* receiving internal clock signal /CLK and an output signal from NAND circuit 15*ad*; an NAND circuit 15*bc* receiving an output signal from NAND circuit 15*ba* at one input; and an NAND circuit 15*bb* receiving an output signal from NAND circuit 15*bb* at one input. An output signal from NAND circuit 15*bb* is applied to the other input of NAND circuit 15*bc*, while an output signal from NAND circuit 15*bc* is applied to the other input of NAND circuit 15*bd*. Also in this shift circuit 15*b*, NAND circuits 15*ba* and 15*bb* have a function of a transfer gate which operates in accordance with internal clock signal /CLK, and NAND circuits 15*bc* and 15*bd* constitute a latch circuit for latching an applied signal. Now, the operation of the mask control circuit shown in FIG. 17A will be described with reference to a timing chart shown in FIG. 17B.

Mask designation signal DQMIN is at L level in a clock cycle #0. When internal clock signal CLK is at H level, in shift circuit 15*a*, NAND circuits 15*aa* and 15*ab* operate as inverters, so that the output signal from NAND circuit 15*ad* attains H level, and signal DQMO from NAND circuit 15*ac* responsibly attains L level. In shift circuit 15*b*, internal clock signal /CLK is at L level, whereas the output signals from NAND circuits 15*ba* and 15*bb* are at H level regardless of the output signal from shift circuit 15*a*. Thus, the state of output signal DQM1 from shift circuit 15*b* is not changed, maintaining L level in an initial state. Similarly, shift circuit 15*c* incorporates output signal DQM1 from shift circuit 15*b*, and internal mask designation signal DQMOT is at L level when internal clock signal CLK is at H level.

When internal clock signal CLK falls to L level, output signals from NAND circuits 15*aa* and 15*ab* in shift circuit 15*a* are fixed at H level, and shift circuit 15*a* is brought into a latching state. Shift circuit 15*b* incorporates output signal DQMO from shift circuit 15*a* when internal clock signal /CLK attains H level, and output signal DQM1 of shift circuit 15*b* is similarly fixed at L level. Shift circuit 15*c* is in the latching state as shift circuit 15*a*.

In clock cycle #1, mask designation signal DQMIN rises to H level. When internal clock signal CLK attains H level, in shift circuit 15*a*, NAND circuits 15*aa* and 15*ab* operate as inverters, the output signal from NAND circuit 15*aa* attains L level, and responsively signal DQMO from NAND circuit 15*ac* attains H level. Shift circuit 15*b* is in the latching state and the state of its output signal DQM1 is unchanged. Shift circuit 15*c* incorporates signal DQM1 to output internal mask designation signal DQMOT at L level.

When internal clock signal CLK falls to L level, shift circuit 15*a* is brought into the latching state and signal DQMO is retained at H level. In shift circuit 15*b*, NAND circuits 15*ba* and 15*bb* operate as inverters, and output signal DQM1 rises to H level in accordance with signal DQMO. As shift circuit 15*c* is in the latching state, internal mask designation signal DQMOT maintains L level.

In clock cycle #2, when internal clock signal CLK rises to H level again, shift circuit 15*a* incorporates mask designation signal DQMIN at L level and its output signal DQMO falls to L level. Shift circuit 15*b* is in the latching state and its output signal DQM1 retains H level. Shift circuit 15*c* incorporates signal DQM1 at H level and raises internal mask designation signal DQMOT, an output signal of shift circuit 15*c*, to H level.

In clock cycle #2, when internal clock signal CLK rises to L level, shift circuits 15*a* and 15*c* are brought into the latching state. Meanwhile, shift circuit 15*b* incorporates signal DQMO and falls its output signal DQM1 to L level. In clock cycle #3, when internal clock signal CLK rises to H level, shift circuit 15*c* incorporates signal DQM1 at L level from shift circuit 15*b*, and drives its internal mask designation signal DQMOT to L level. In this cycle, mask designation signal DQMIN is at L level and signals DQMO and DQM1 maintain L level. The same operation also happens in clock cycle #4.

The masking operation of mask control circuit 15 is related to the operation of the column related circuit, and preferably stopped when it is not necessary in terms of power consumption. On the other hand, operating mask control circuit 15 in accordance with column related internal clock signal CLKD results in a following problem.

A synchronous semiconductor memory device as shown in FIG. 18 is now considered in which CAS latency is one and an interval between an active command and a read command may be as short as one clock cycle, that is, an RAS-CAS precharge time in a standard DRAM may be one clock cycle. Column related internal clock signal CLKD is applied to mask control circuit 15 instead of internal clock signal CLK, different from the arrangement of FIG. 17A. Applying an active command in clock cycle #1 drives a column related clock activation signal ENA into the active state in clock cycle #1, and column related internal c-lock signal CLKD will be produced in clock cycles starting from clock cycle #2.

When a read command is applied in clock cycle #3, valid data is output from clock cycle #4. In clock cycle #4, when external mask designation signal extDQM is set in the active state, read out data is masked in clock cycle #6, two clock cycles after from clock cycle #4. The reading of data "2" is not therefore performed. After reading four data, external mask designation signal extDQM is reset at H level in a clock cycle #8. Clock activation signal ENA is driven into an inactive state as every operation of column related circuits related to column selection and data inputting/outputting is completed in clock cycle #8. Thus, in clock cycle #8, when column related internal clock signal CKD rises to H level and signals DQM0 and DQM1 attain H level, column related internal clock signal CLKD maintains L level in subsequent clock cycles, and shift circuits 15*a* and 15*c* are brought into the latching state. Signals DQMO and DQM1 from shift circuits 15*a* and 15*c* maintain H level and internal mask designation signal DQMOT maintains L level.

An active command is again applied in a clock cycle #10, column related clock activation signal ENA is brought into the active state, and a read command is applied in a clock cycle #11. L level of the clock signal CLKD is maintained in clock cycle #10 as column related internal clock signal CLKD has not yet been produced therein. In this state, signals DQM0 and DQM1 maintain H level, while internal mask designation signal DQMOT also maintains L level.

When column related internal clock signal CLKD is produced in a clock cycle #11, signal DQMO falls to L level, and in response to the fall of column related internal clock signal CLKD, signal DQM1 falls to L level. On the other hand, when column related internal clock signal CLKD is produced to attain H level, shift circuit 15c shown in FIG. 17A incorporates signal DQM1 at H level, so that internal mask designation signal DQMOT attains H level and falls to L level in a clock cycle #12. Thus, even when data output activation signal OEM is activated to attain H level in clock cycle #11, output enable signal OEMD maintains L level, and is not brought to H level until clock cycle #12. As a result, even when the reading of the data is performed with CAS latency of one by applying the read command in clock cycle #11, the initial data is unexpectedly masked, and therefore all the data except the initial data ("0") will be read out in clock cycles starting from a clock cycle #13.

In the synchronous semiconductor memory device, a user can set CAS latency at a suitable value in accordance with a system used. Given that the RAS-CAS delay time in the standard DRAM is elapsed, the read command can also be applied in a suitable timing. The timing at which the mask designation signal is brought into the active state to mask the read out data is suitably determined by the user in accordance with the content of processing, and therefore it cannot be predicted in advance. To satisfy these conditions, the mask control circuit cannot stop its operation even when the generation of column related internal clock signal CLKD is prohibited. Therefore the shift operation of the mask control circuit must be always performed, and internal clock signal CLK is applied to the mask control circuit as shown in FIG. 17A. The operation of masking the read out data however affects the circuitry only in the portion related to data inputting/outputting. Therefore, current consumption can be greatly reduced if the mask control circuit is operated in accordance with a column related clock signal and its operation can be stopped whenever it is not necessary.

Here, note that external mask designation signal extDQM is in the active state after reading out of the data is completed. This is because external mask designation signal extDQM is controlled such that it is set in the inactive state only when necessary data is read out in a process system. In other words, external mask designation signal extDQM enters the inactive state only when reading of data is necessary, and it is set in the active state to prohibit the data read out operation when the data needs not be read out. When such a control signal is used, it is apparent that external mask designation signal extDQM will be retained in the active state at H level when column related internal clock signal CLKD is not generated. As a result, the operation shown in FIG. 18 is performed, and therefore correct data cannot be read out.

Further, when a shift circuit is used, the current consumption for the shift circuit can be reduced by applying a clock signal only when the shift operation is necessary to operate the shift circuit. However, assume that, in such a shift circuit, an operation for its output signal is performed or predetermined control is performed in accordance with the output signal. If the internal state is retained as it is at the stop of the clock signal as long as the clock signal is kept stopped and if shift operation becomes necessary and the clock signal is applied, the signal latched upon the clock stop is output, thereby disadvantageously prohibiting generation of a correct output signal.

SUMMARY OF THE INVENTION

It is an object of the present invention to provide a clock shift circuit capable of outputting a correct output signal upon reapplication of a clock signal even when the cock signal is stopped.

It is another object of the present invention to provide a clock shift circuit device capable of correctly operating even if structured such that it receives a clock signal only as needed to reduce power consumption.

It is still another object of the present invention to provide a synchronous semiconductor memory device allowing reduction in current consumption in the circuit portion for masking output data.

It is a further object of the present invention to provide a synchronous semiconductor memory device with an output data mask control circuit which never malfunctions even if operated as needed.

A synchronous semiconductor memory device according to a first aspect of the present invention includes: read/output circuitry responsive to a data read designation for reading out and externally outputting the data in a selected memory cell in synchronization with an internal clock signal; internal mask generation circuitry receiving a mask designation signal for masking the data output from the read/output circuitry for generating an internal mask designation through shift operation in synchronization with the internal clock signal; internal clock generation circuitry responsive to a clock activation signal for generating the internal clock signal in synchronization with a clock signal and applying it to the read/output circuitry and the internal mask generation circuitry; mask circuitry responsive to activation of the internal mask designation for stopping external data output from the read/output circuitry; and reset circuitry responsive to inactivation of the clock activation signal for resetting the internal mask generation circuitry.

A synchronous semiconductor memory device according to a second aspect of the present invention includes: clock generation circuitry responsive to activation of a clock activation signal for generating an internal clock signal in synchronization with a clock signal; read activation circuitry responsive to a data read designation signal applied in synchronization with the clock signal for driving an output enable signal into an active state for prescribed period of time; output circuitry for externally outputting the internal read out data applied in synchronization with the clock signal upon activation of the output enable signal; internal mask generation circuitry receiving a mask designation signal for masking output data from the output circuitry for generating an internal mask designation signal in synchronization with the internal clock signal; circuitry responsive to activation of the internal mask designation for inactivating the output enable signal; and reset circuitry responsive to inactivation of the clock activation signal for resetting the internal mask generation circuitry into an initial state in which the output from the internal mask generation circuitry is brought into an inactive state.

A clock shift circuit according to a third aspect of the present invention performs shift operation in synchronization with a clock signal generated upon activation of a clock activation signal, and includes shift circuitry receiving and shifting an applied signal in synchronization with the clock signal for output, and reset circuitry responsive to inactivation of a clock activation signal for resetting the shift circuitry into the initial state.

The circuit is structured such that the internal mask generation circuitry or the shift circuitry for shift operation upon application of the internal clock signal is reset when the clock signal to be applied thereto is not generated, and therefore the internal state of the internal mask generation circuitry or the shift circuitry upon application of the clock signal is in the initial state, and the data applied upon reapplication of the clock signal can be incorporated and correctly necessary data is output at a desired timing, thereby preventing malfunction of the circuit. In addition, these circuits can be operated only as needed, reducing current consumption in the circuit portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
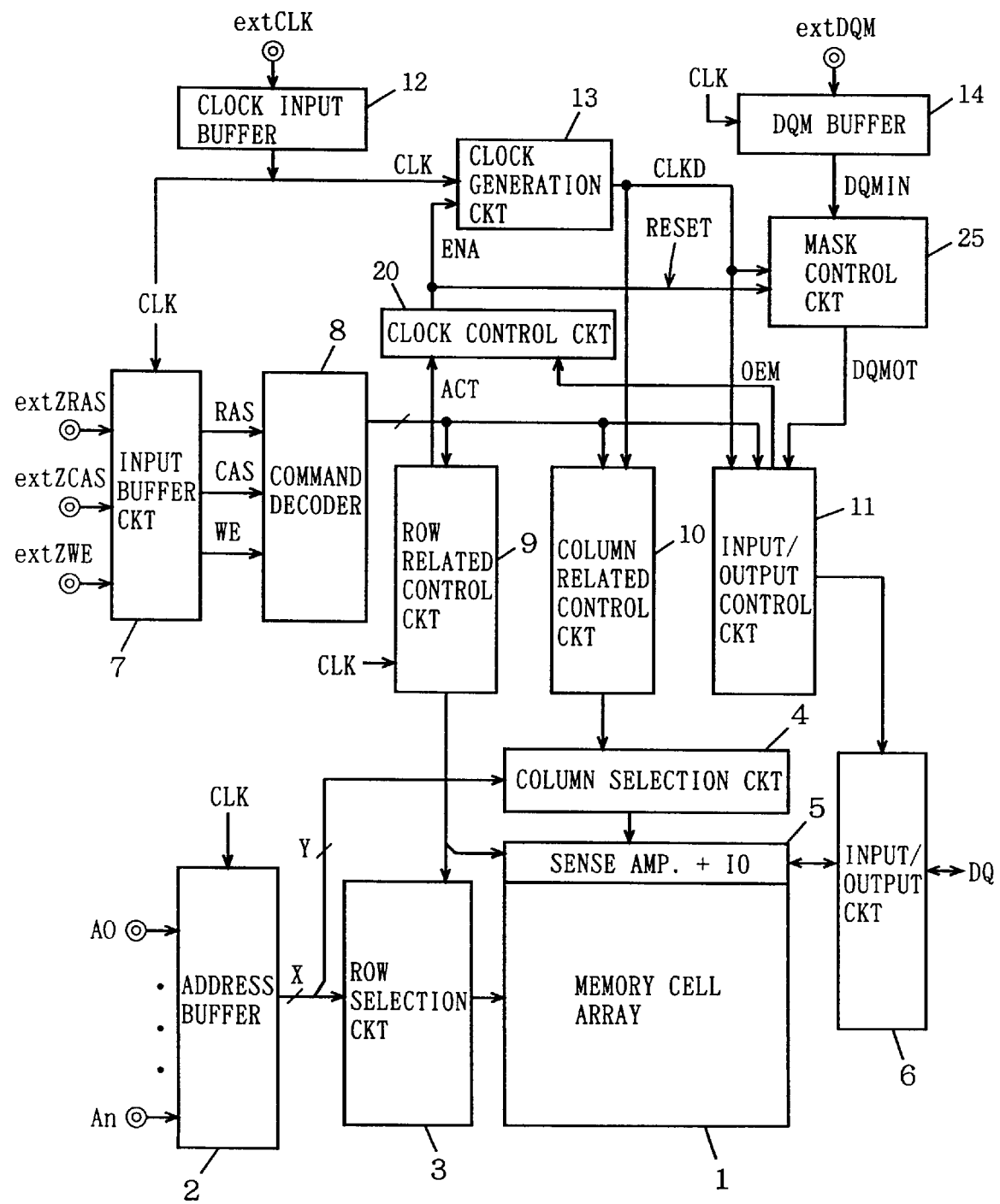
FIG. 1 schematically shows an overall arrangement of a synchronous semiconductor memory device according to a first embodiment of the present invention.

FIG. 1 schematically shows an overall arrangement of a synchronous semiconductor memory device according to a first embodiment of the present invention. Referring to FIG. 1, the synchronous semiconductor memory device according to the first embodiment of the present invention includes, as in the conventional example, a memory cell array 1, an address buffer 2, a row selection circuit 3, a column selection circuit 4, a sense amplifier +IO gate block 5, an input/output circuit 6, an input buffer circuit 7, a command decoder 8, a row related control circuit 9, a column related control circuit 10 and an input/output control circuit 11. The arrangement of these circuits is similar to that in the conventional example, and command decoder 8 produce an operation mode designation signal in accordance with the states of control signals RAS (/RAS), CAS (/CAS) and WE (/WE) supplied through input buffer circuit 7 at the rising edge of a clock signal CLK. Row related control circuit 9, column related control circuit 10 and input/output control circuit 11 each generate a control signal required for performing the designated operation in accordance with an operation mode designation signal from command decoder 8. Row related control circuit 9 operates in accordance with an internal clock signal CLK from a clock input buffer 12, whereas column related control circuit 10 and input/output control circuit 11 operate in accordance with a column related internal clock signal CLKD from a clock generation circuit 13.

Clock generation circuit 13 generates column related internal clock signal CLKD in accordance with internal clock signal CLK applied from clock input buffer 12 upon activation of a column related clock activation signal ENA from a clock control circuit 20. Clock control circuit 20 drives column related clock activation signal ENA into an active state upon activation of an array activation signal ACT from row related control circuit 9 and a data output activation signal OEM from input/output control circuit 11. Input/output control circuit 11 outputs data in accordance with a CAS latency even when row related control (circuit 9 drives memory cell array 1 into an inactive state by a precharge command. Data output activation signal OEM is applied to clock control circuit 20 in order to ensure that the remaining burst length data is output even upon inactivation of the array.

The synchronous semiconductor memory device further includes control circuit 25 for generating an internal mask designation signal DQMOT using a mask designation signal DQMIN from DQM buffer 14 generates internal mask designation signal DQMOT in accordance with mask designation signal DQMIN only upon activation of column related clock activation signal ENA from clock control circuit 20. When column related clock activation signal ENA is inactivated, mask control circuit 25 has every one of its internal nodes to be reset in the initial state, and responsibly internal mask designation signal DQMOT is also retained in the inactive state. Thus, even when column related internal clock signal CLKD is reapplied, mask control circuit 25 can start its operation in the initial state and generate internal mask designation signal DQMOT correctly in accordance with mask designation signal DQMIN, thereby preventing the read out data from being erroneously masked.

Figure 2:
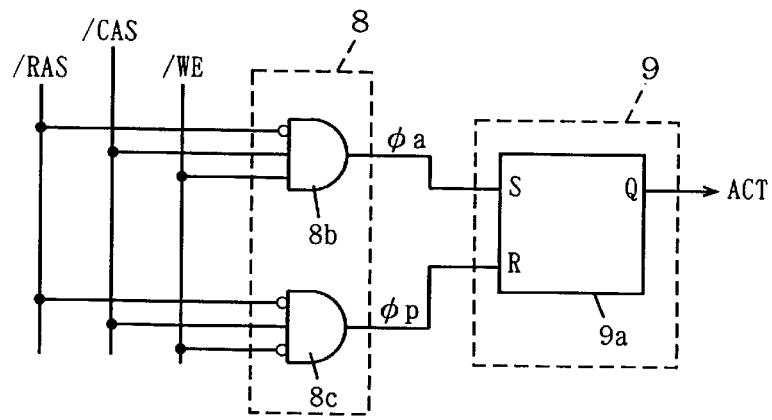
FIG. 2 schematically shows a structure of a command decoder and a row related control circuit shown in FIG. 1.

FIG. 2 schematically shows a structure of command decoder 8 and row related control circuit 9 shown in FIG. 1. Referring to FIG. 2, command decoder 8 includes an active command decoder 8b for detecting application of an active command and a precharge command decoder 8c for detecting application of a precharge command. Active command decoder 8b drives an array activation designation signal φa into the active state when a row address strobe signal /RAS is at L level and a column address strobe signal /CAS and a write enable signal /WE are at H level. Precharge command decoder 8c drives a precharge designation signal φp into the active state when row address strobe signal /RAS and write enable signal /WE are both at L level and column address strobe signal /CAS is at H level.

Row related control circuit 9 includes a set/reset flip-flop 9a responsive to activation of array activation designation signal φa to be set and responsive to activation of precharge designation signal φp to be reset. Set/reset flip-flop 9a outputs an array activation signal ACT activating row selection operation from an output Q.

Figure 3:
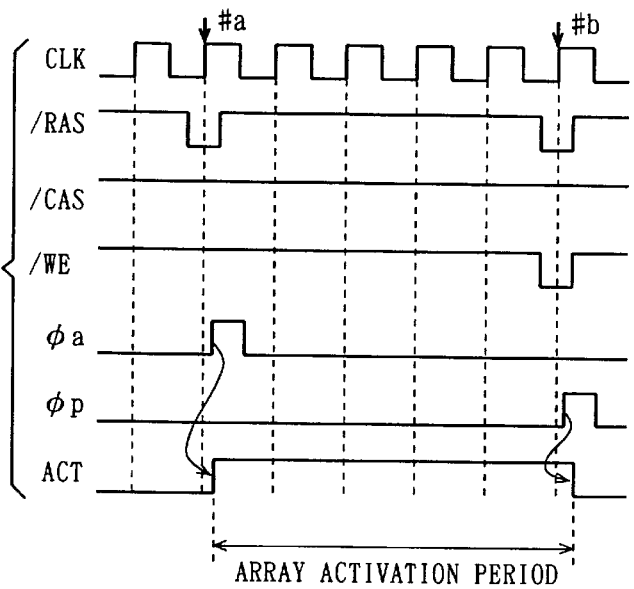
FIG. 3 is a timing chart representing the operation of the circuit shown in FIG. 2.

More specifically, referring to FIG. 3, in a clock cycle #a, when row address strobe signal /RAS as well as column address strobe signal /CAS and write enable signal /WE are respectively set at L and H levels for application of an active command, array activation designation signal φa from active command decoder 8b is brought into the active state at H level for a prescribed period of time, set/reset flip-flop 9a is set, and array activation signal ACT is brought into the active state at H level. Array activation signal ACT corresponds to an internal row address strobe signal in a standard DRAM, and address buffer 2 latches an applied address signal to generate an internal row address signal X in accordance with activation of array activation signal ACT. This is followed by row selection operation by row selection circuit 3, and then sense operation by a sense amplifier. Precharge/equalize operation of a bit line in memory cell array 1 also stops in accordance with array activation signal ACT.

In a clock cycle #b, when row address strobe signal /RAS and write enable signal /WE as well as column address strobe signal /CAS are respectively set at L and H levels, a precharge command is applied and precharge designation signal φp from precharge command decoder 8c is brought into the active state at H level for a prescribed period of time. Responsibly, set/reset flip-flop 9a is reset and array activation signal ACT is brought into the inactive state at L level. In response to inactivation of array activation signal ACT, row selection circuit 3 and the sense amplifier are driven into the inactive state, and the bit line precharge/equalize circuit not shown in the drawings is also activated to perform precharge of each column in memory cell array 1 to a prescribed potential level.

Figure 4A:
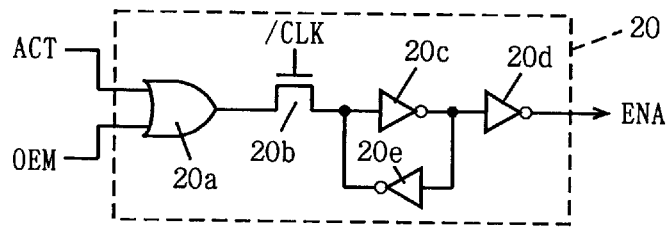
FIG. 4A shows a structure of a clock control circuit shown in FIG. 1.
Figure 4B:
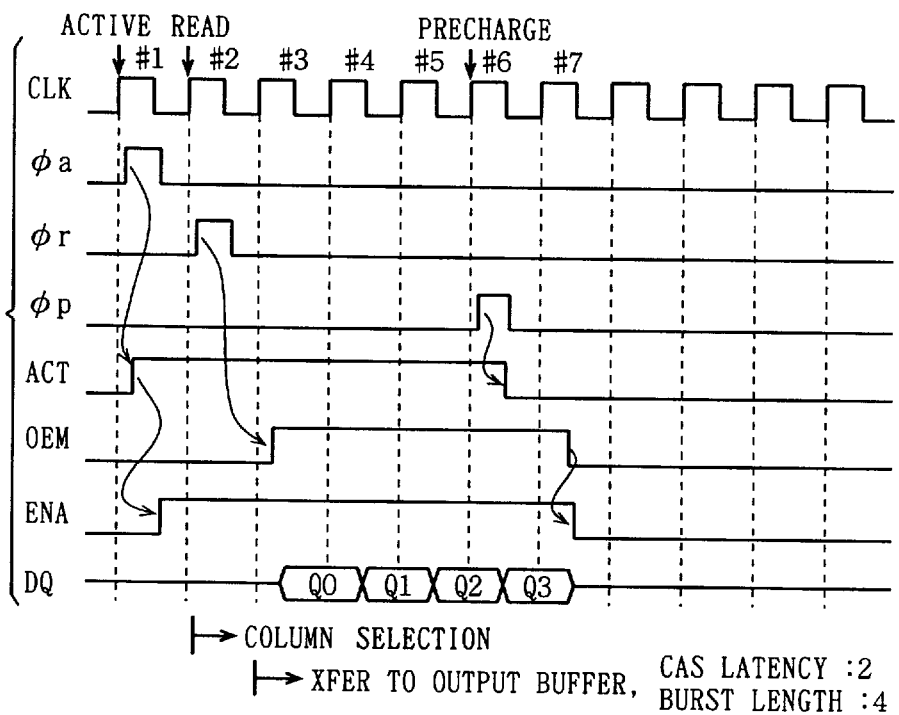
FIG. 4B is a timing chart representing the operation of the clock control circuit.

FIG. 4A exemplifies a structure of clock control circuit 20 shown in FIG. 1. Referring to FIG. 4A, clock control circuit 20 includes: an OR circuit 20a receiving array activation signal ACT and data output activation signal OEM; a transfer gate 20b formed of an n channel MOS transistor which is made conductive when internal clock signal /CLK is at H level for passing an output signal from OR circuit 20a; an inverter 20c inverting a signal from transfer gate 20b; an inverter 20d inverting an output signal from inverter 20c to output a column related clock activation signal ENA; and an inverter 20e inverting an output signal from inverter 20c for transmission to an input of inverter 20c. Inverters 20c and 20e constitute an inverter latch. Transfer gate 20b and inverters 20c, 20d and 20e delay an output signal from OR circuit 20a by a half cycle of internal clock signal CLK to output column related clock activation signal ENA. Now, the operation of clock control circuit 20 shown in FIG. 4A will be described with reference to a timing chart shown in FIG. 4B. FIG. 4B shows operation waveforms in data reading when a CAS latency is two and a burst length is four.

In clock cycle #1, an active command is applied, array activation designation signal φa maintains H level for a prescribed period of time, and responsively array activation signal ACT attains H level. Transfer gate 20b is made conductive in synchronization with the fall of internal clock signal CLK in clock cycle #1, thereby passing the output signal from OR circuit 20a. Thus, column related clock activation signal ENA is brought into the active state at H level in synchronization with the fall of internal clock signal CLK.

A read command is applied in clock cycle #2, thereby maintaining data read operation designation signal φr at H level for a prescribed period of time. Column selection operation of column selection circuit 4 shown in FIG. 1 internally begins in accordance with the read command. Meanwhile, as the CAS latency is two, data output activation signal OEM is brought into the active state at H level in a next clock cycle #3. Data output activation signal OEM maintains H level for a period of the burst length, that is, for four clock cycles.

In clock cycle #2, memory cell data on a selected column is transmitted into an input/output circuit (with reference to FIG. 1). In clock cycle #3, data output activation signal OEM is brought into the active state at H level, an output circuit is enabled, and data selected by the column selection circuit is output as an output data Q0. Column selection operation is performed in each of clock cycles #3, #4 and #5, and data in the selected memory cell is transmitted into an output buffer. The column selection operation is completed in a clock cycle #6.

In clock cycle #6, when a precharge command is applied and a precharge designation signal φp maintains H level for a prescribed period of time, array activation signal ACT is brought into the inactive state at L level. Even if array activation signal ACT is driven into the inactive state in clock cycle #6, the column selection operation by the column selection circuit is already completed, so that final data of the burst length data would be transmitted to the output buffer in clock cycle #6. Therefore, all burst data can be correctly read out.

Data output activation signal OEM falls to L level in a clock cycle #7 as it maintains H level for a period of the burst length. Transfer gate 20b is made conductive in synchronization with the fall of internal clock signal CLK in clock cycle #7 to pass a signal at L level supplied from OR circuit 20a. Thus, column related clock activation signal ENA is brought into the inactive state at L level in clock cycle #7, transmission of a column related clock signal for input/output control circuit 11 and column related control circuit 10 is stopped, and hence the operation of these circuits stops.

As in the foregoing, generating column related clock activation signal ENA in accordance with array and data output activation signals ACT and OEM ensures that the column related clock signal is applied into control portions of these column related circuits for memory cell selection as well as transmission and output of the selected memory cell data for a period in which the column related circuits can operate.

Here, the inverted signal from internal clock signal CLK is used to produce column related clock activation signal ENA so as to ensure that transmission of a column related clock is stopped upon completion of data output in clock cycle #7 when the final burst length data is output in clock cycle #7. Even if column related clock activation signal ENA is activated in synchronization with the fall of internal clock signal CLK in clock cycle #1 in which the active command is applied, not the column related circuit but only the row related circuit operates in clock cycle #1. Therefore, column related clock signals can be applied starting from next clock cycle #2 for operation of the column related circuit, so as to prevent transmission of internal clock signal CLK in an incomplete shape, and hence generation of a column related clock signal.

Figure 5A:
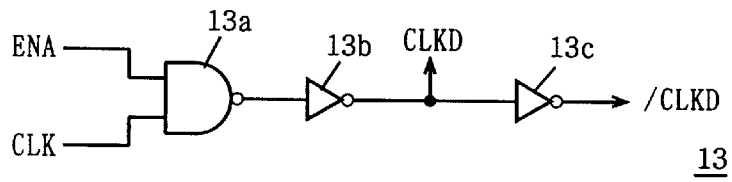
FIG. 5A exemplifies a structure of a clock generation circuit shown in FIG. 1.
Figure 5B:
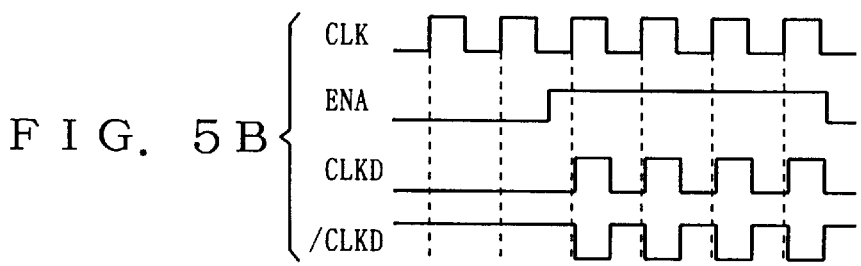
FIG. 5B is a timing chart representing the operation of the clock generation circuit.

FIG. 5A exemplifies a structure of clock generation circuit 13 shown in FIG. 1. Referring to FIG. 5A, clock generation circuit 13 includes: an NAND circuit 13a receiving column related clock activation signal ENA and internal clock signal CLK; an inverter 13b receiving an output signal from NAND circuit 13a to output column related internal clock signal CLKD; and an inverter 13c receiving an output signal from inverter 13b to output a complementary column related internal clock signal /CLKD. The operation of clock generation circuit 13 shows in FIG. 5A will now be described with reference to a timing chart shown in FIG. 5B.

When column related clock activation signal ENA is at L level, the output signal from NAND circuit 13a is fixed at H level, and column related internal clock signal CLKD and complementary column related internal clock signal /CLKD are respectively fixed at L and H levels.

When column related clock activation signal ENA attains H level, NAND circuit 13a operates as an inverter, and column related internal clock signals CLKD and /CLKD are generated in accordance with internal clock signal CLK. In the structure of the clock generation circuit shown in FIG. 5A, column related clock activation signal ENA is activated/inactivated in synchronization with the fall of internal clock signal CLK. Thus, column related internal clock signals CLKD and /CLKD are generated starting from a clock cycle next to a cycle in which column related clock activation signal ENA is brought into the active state, column related clock signals CLKD and /CLKD are generated in the clock cycle upon inactivation of column related clock activation signal ENA, and generation of column related clock signals CLKD and /CLKD will be stopped starting from the next clock cycle.

Figure 6:
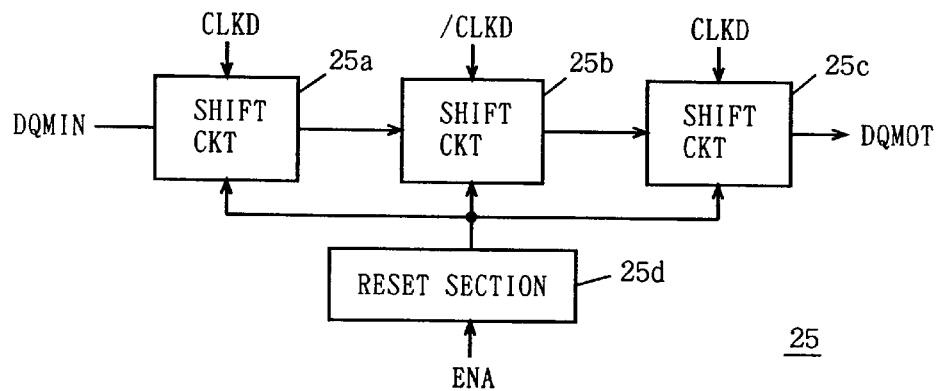
FIG. 6 schematically shows an arrangement of a mask control circuit shown in FIG. 1.

FIG. 6 schematically shows a structure of mask control circuit 25 shown in FIG. 1. Referring to FIG. 6, mask control circuit 25 includes cascaded three stage shift circuits 25a, 25b and 25c. Column related internal clock signal CLKD is supplied into shift circuits 25a to 25c. Shift circuit 25a incorporates and shifts a mask designation signal DQMIN in accordance with column related internal clock signal CLKD for output. Shift circuit 25b incorporates and latches an output signal from shift circuit 25a in accordance with complementary column related internal clock signal /CLKD. Shift circuit 25c incorporates and latches an output signal from shift circuit 25b in accordance with column related internal clock signal CLKD to output an internal mask designation signal DQMOT. Each of shift circuits 25a to 25c is brought into an through state to incorporate and output an applied column related internal clock signal if the applied clock signal is at H level, and brought into a latching state of retaining the incorporated signal if the applied column related internal clock signal is at L level.

Mask control circuit 25 further includes a reset section 25d responsive to inactivation of column related clock activation signal ENA for resetting outputs from these shift circuit 25a to 25c into the initial state, that is, the inactive state. While the structure of reset section 25d will be later described in detail, any structure may be employed in which all the internal nodes in shift circuits 25a to 25c can be set into the initial state upon inactivation of column related clock activation signal ENA.

Column related internal clock activation signal ENA is brought into the inactive state when generation of column related internal clock signal CLKD is stopped even if mask designation signal DQMIN is brought into the active state before column related internal clock signal CLKD is stopped. Then, internal nodes in these shift circuits 25a to 25c are reset in the initial state by reset section 25d, thereby making mask designation signal DQMIN in the active state invalid. Thus, it is ensured that shift operation can be performed from the initial state when shift operation by these shift circuits 25a to 25c restarts.

Figure 7:
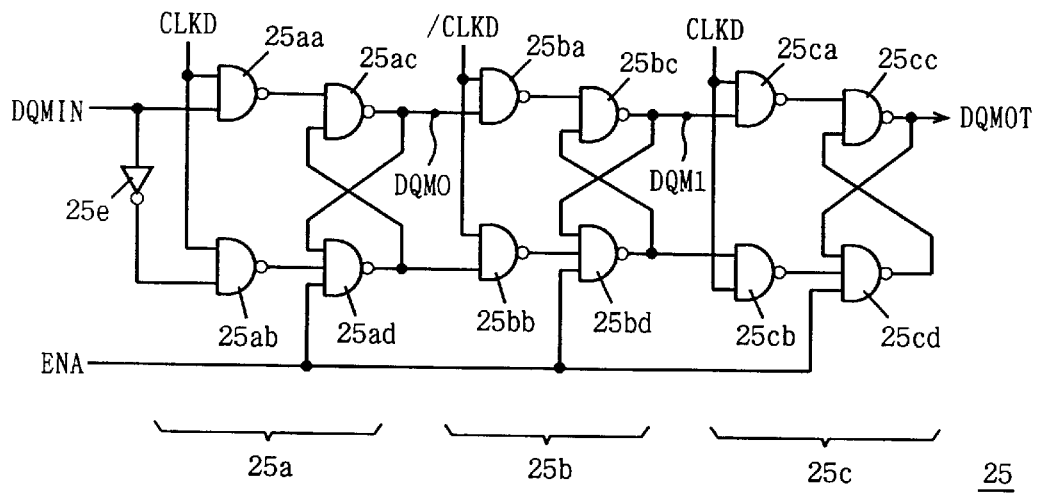
FIG. 7 specifically exemplifies a structure of the mask control circuit shown in FIG. 1.

FIG. 7 specifically exemplifies a structure of mask control circuit 25 shown in FIGS. 1 and 6. Referring to FIG. 7, mask control circuit 25 includes three stage shift circuits 25a, 25b and 25c. Each of these shift (circuits 25a, 25b and 25c is internally provided with the reset section shown in FIG. 6. Shift circuit 25a includes: an NAND circuit 25aa a receiving mask designation signal DQMIN and column related internal clock signal CLKD; an NAND circuit 25ab receiving column related internal clock signal CLKD and mask designation signal DQMIN supplied through inverter 25e; an NAND circuit 25ac receiving an output signal from NAND circuit 25aa at one input; and an NAND circuit 25ad with three inputs receiving output signals from NAND circuits 25ab and 25ac as well as column related clock activation signal ENA. NAND circuit 25ac receives an output signal from NAND circuit 25ad at the other input.

Shift circuit 25b includes: an NAND circuit 25ba receiving an output signal from NAND circuit 25ac and a complementary column related internal clock signal /CLKD; an NAND circuit 25bb receiving complementary column related internal clock signal /CLKD and an output signal from NAND circuit 25ad; an NAND circuit 25bc receiving an output signal from NAND circuit 25ba at one input; and an NAND circuit 25bd with three inputs receiving output signals from NAND circuits 25bb and 25bc as well as column related internal clock activation signal ENA. An output signal from NAND circuit 25bd is applied to the other input of NAND circuit 25bc.

Shift circuit 25c includes: an NAND circuit 25ca receiving column related internal clock signal CLKD and an output signal DQM1 from NAND circuit 25bc; an NAND circuit 25cb receiving column related internal clock signal CLKD and an output signal from NAND circuit 25bd; an NAND circuit 25cc receiving an output signal from NAND circuit 25ca at one input; and an NAND circuit 25cd receiving output signals from NAND circuits 25cb and 25cc as well as column related clock activation signal ENA. An output signal from NAND circuit 25cd is applied to the other input of NAND circuit 25cc. An internal mask designation signal DQMOT is output from NAND circuit 25cc.

In the structure of mask control circuit 25 shown in FIG. 7, three-input NAND circuits 25ad, 25bd and 25cd function as reset sections. More specifically, output signals from these NAND circuits 25ad, 25bd and 25cd are fixed at H level when column related clock activation signal ENA is in the inactive state at L level. When column related clock activation signal ENA is in the inactive state at L level, column related internal clock signal CLKD and complementary column related internal clock signal /CLKD are respectively fixed at L and H levels. Thus, an output signal from NAND circuit 25aa attains H level, and responsively NAND circuit 25ac receives the signals at H level at its both inputs, and the output signal DQMO is fixed at L level. Complementary column related internal clock signal /CLKD is fixed at H level, an output signal from NAND circuit 25ac is at L level, and an output signal from NAND circuit 25ba is fixed at H level. NAND circuit 25bb also receives the signals at H level at its both inputs to output a signal at L level.

NAND circuit 25bd outputs a signal at H level in accordance with column related clock activation signal ENA in the inactive state. Thus, an output signal DQM1 from NAND circuit 25bc is fixed at L level. Output signals from NAND circuits 25ca and 25cd are both fixed at H level, so that internal mask designation signal DQMOT is also fixed at L level. Then, when column related clock activation signal ENA is in the inactive state at L level, signals DQM0, DQM1 and DQMOT are all fixed at L level. This state corresponds to that in which mask designation signal DQMIN is set at L level when column related clock activation signal ENA is in the active state at H level and column related internal clock signals CLKD and /CLKD are produced.

In accordance with inactivation of column related clock activation signal ENA, the internal states of these signals can be set in the initial state by NAND circuits 25ad, 25bd and 25cd. Thus, even when generation of column related clock signals CLKD and /CLKD is stopped after mask designation signal DQMIN is set at H level and written into shift circuit 25a, the incorporated mask designation signal can be reset back in the initial state by NAND circuit 25ad. Consequently, also upon reapplication of column related internal clock signal CLKD, mask control circuit 25 can operate from the initial state, in accordance with the column related internal clock signal and only as needed, so that current consumption can be reduced without accompanying malfunction of the circuit.

Figure 8:
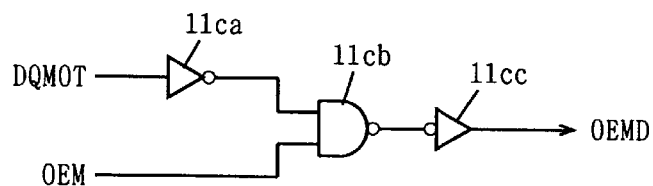
FIG. 8 exemplifies a structure of an output control circuit included in an input/output control circuit shown in FIG. 1.
Figure 14:
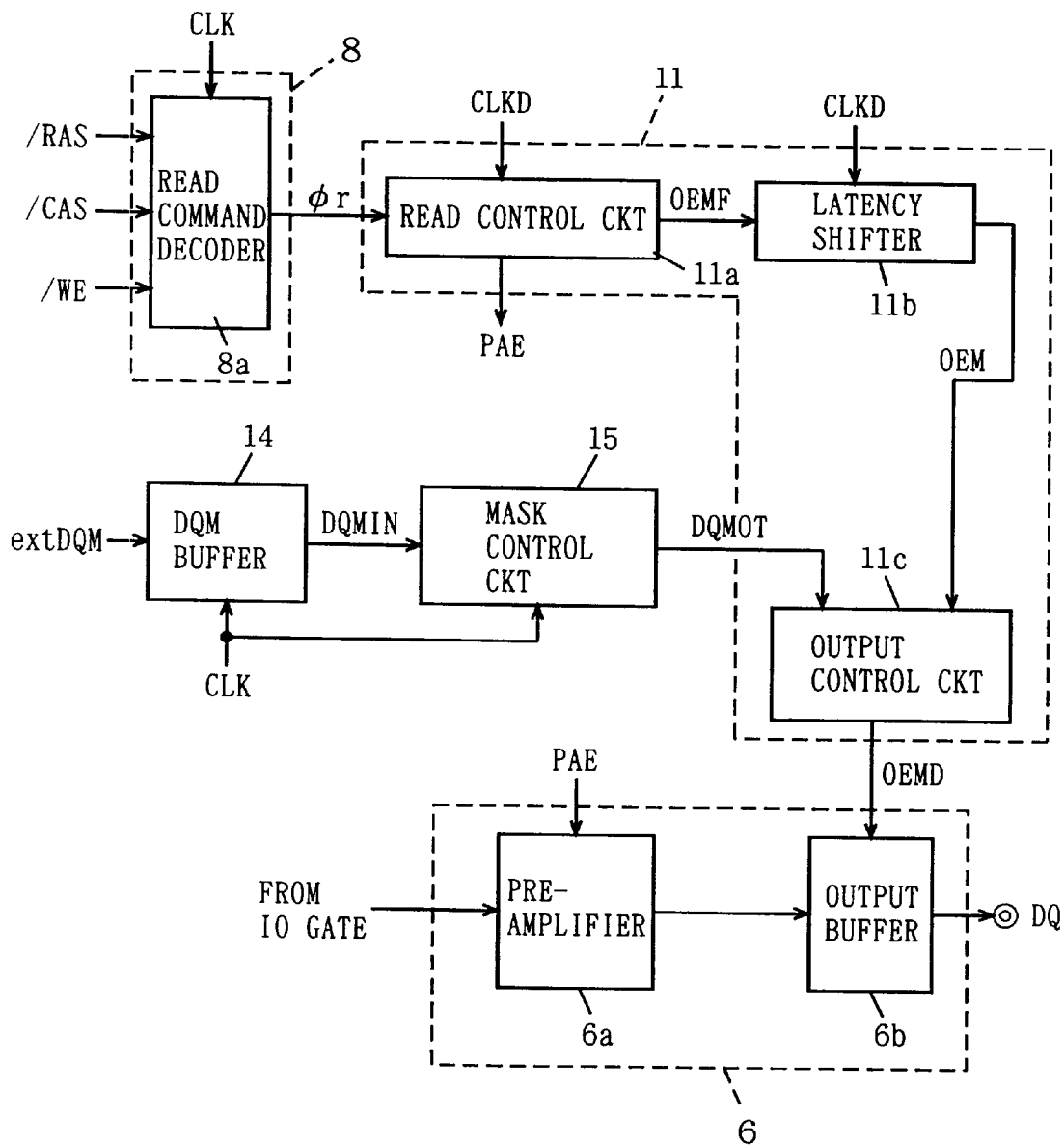
FIG. 14 schematically shows a main portion of the arrangement of the synchronous semiconductor memory device shown in FIG. 13.
Figure 15:
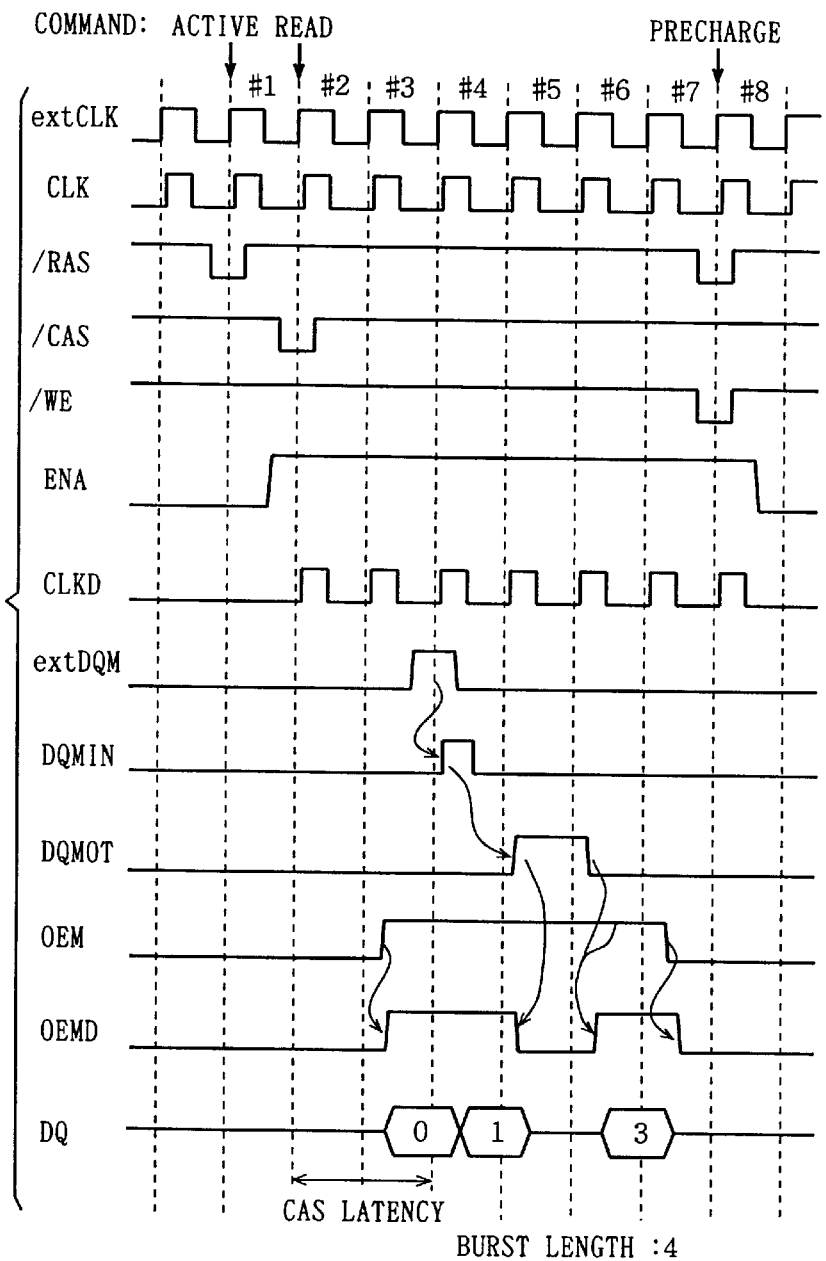
FIG. 15 is a timing chart representing the operation of the conventional semiconductor memory device upon reading out of data.
Figure 16A:
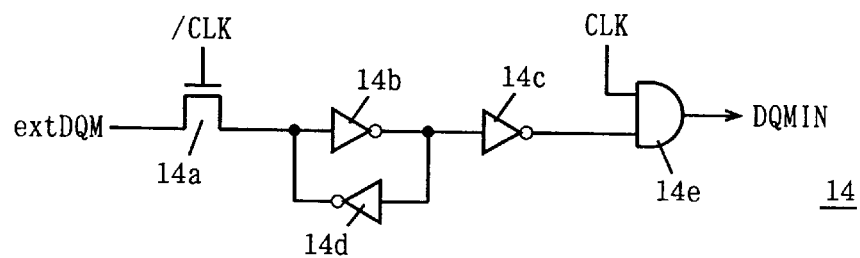
FIG. 16A exemplifies a structure of a DQM buffer shown in FIGS. 1 and 13.
Figure 16B:
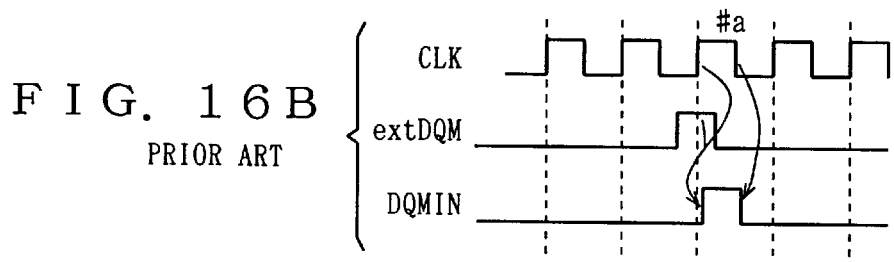
FIG. 16B is a timing chart representing the operation of the DQM buffer.
Figure 17A:
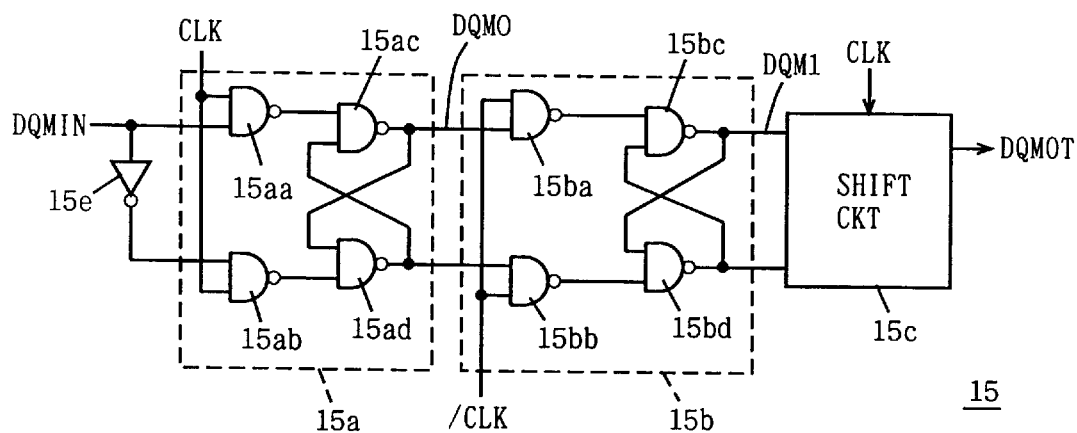
FIG. 17A exemplifies a structure of a mask control circuit shown in FIG. 13.
Figure 17B:
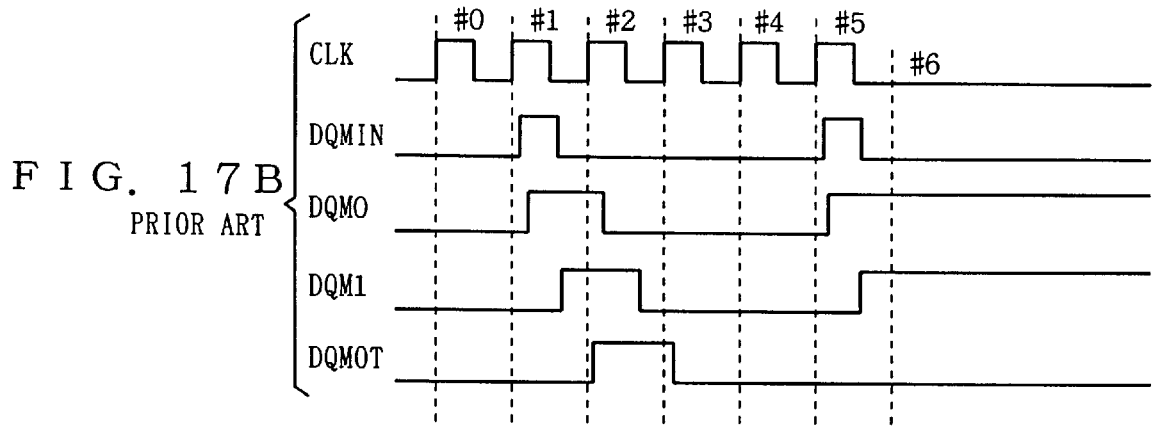
FIG. 17B is a timing chart representing the operation of the mask control circuit.
Figure 18:
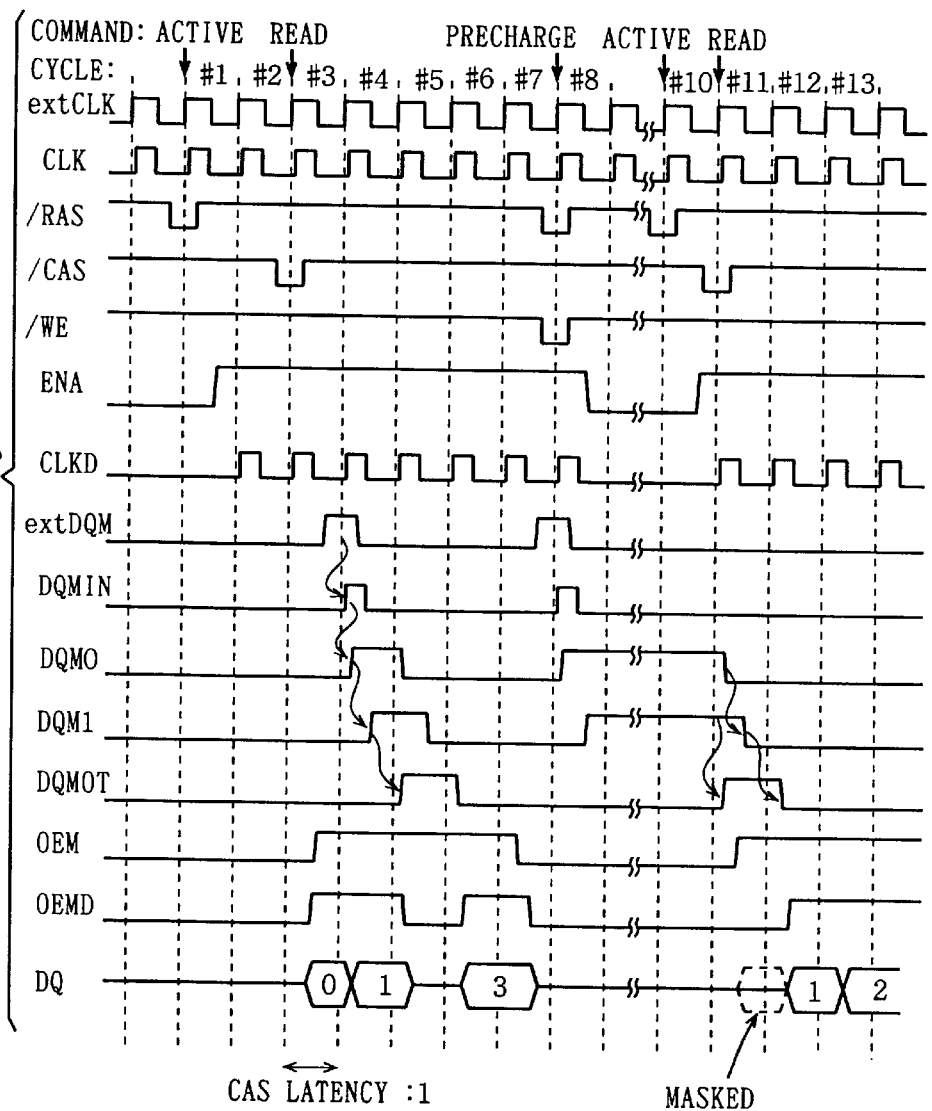
FIG. 18 is a diagram used in describing the problems associated with the conventional synchronous semiconductor memory device.

FIG. 8 shows a structure of an output control circuit included in input/output control circuit 11 shown in FIG. 1. The output control circuit corresponds to the conventional circuitry shown in FIG. 14. Referring to FIG. 8, the output control circuit includes: an inverter 11ca inverting internal mask designation signal DQMOT; an NAND circuit 11cb receiving an output signal from inverter 11ca and a data output activation signal OEM; and an inverter 11cc inverting an output signal from NAND circuit 11cb to output an output enable signal OEMD. In the structure of the output control circuit shown in FIG. 8, output enable signal OEMD is set in the active state at H level to enable data output when internal mask designation signal DQMOT is at L level and data output activation signal OEM is at H level.

Figure 9:
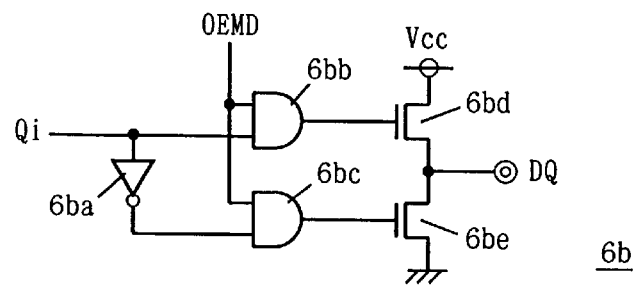
FIG. 9 schematically shows a structure of an output buffer included in the input/output circuit shown in FIG. 1.

FIG. 9 shows a structure of an output buffer included in input/output circuit 6 shown in FIG. 1. The output buffer shown in FIG. 9 corresponds to output buffer 6b shown in FIG. 14. Referring to FIG. 9, output buffer 6b includes: an inverter 6ba receiving an internal read data Qi; an AND circuit 6bb receiving internal read data Qi and output enable signal OEMD; an AND circuit 6bc receiving output enable signal OEMD and an output from inverter 6ba; an n channel MOS transistor 6bd connected between power supply and an output node (DQ) and receiving an output signal from AND circuit 6bb at its gate; and an n channel MOS transistor 6bb connected between the output node (DQ) and a ground node and receiving an output signal from AND circuit 6bc at its gate.

When output enable signal OEMD is at L level, output signals from AND circuits 6bb and 6bc are at L level, MOS transistors 6bd and 6be are turned off and output node DQ is brought into a high impedance state. When output enable signal OEMD attains H level, AND circuits 6bb and 6bc act as buffers. When internal read data Qi is at H level, output signals from AND circuits 6bb and 6bc respectively attain H and L levels, MOS transistor 6bd is turned on, and a signal at H level is transmitted to data output node DQ. On the other hand, when internal read data Qi is at L level, output signals from AND circuits 6bc and 6bb respectively attain H and L levels, MOS transistor 6be is turned on, data output node DQ is discharged to a ground potential level, and data at L level is output.

Figure 10:
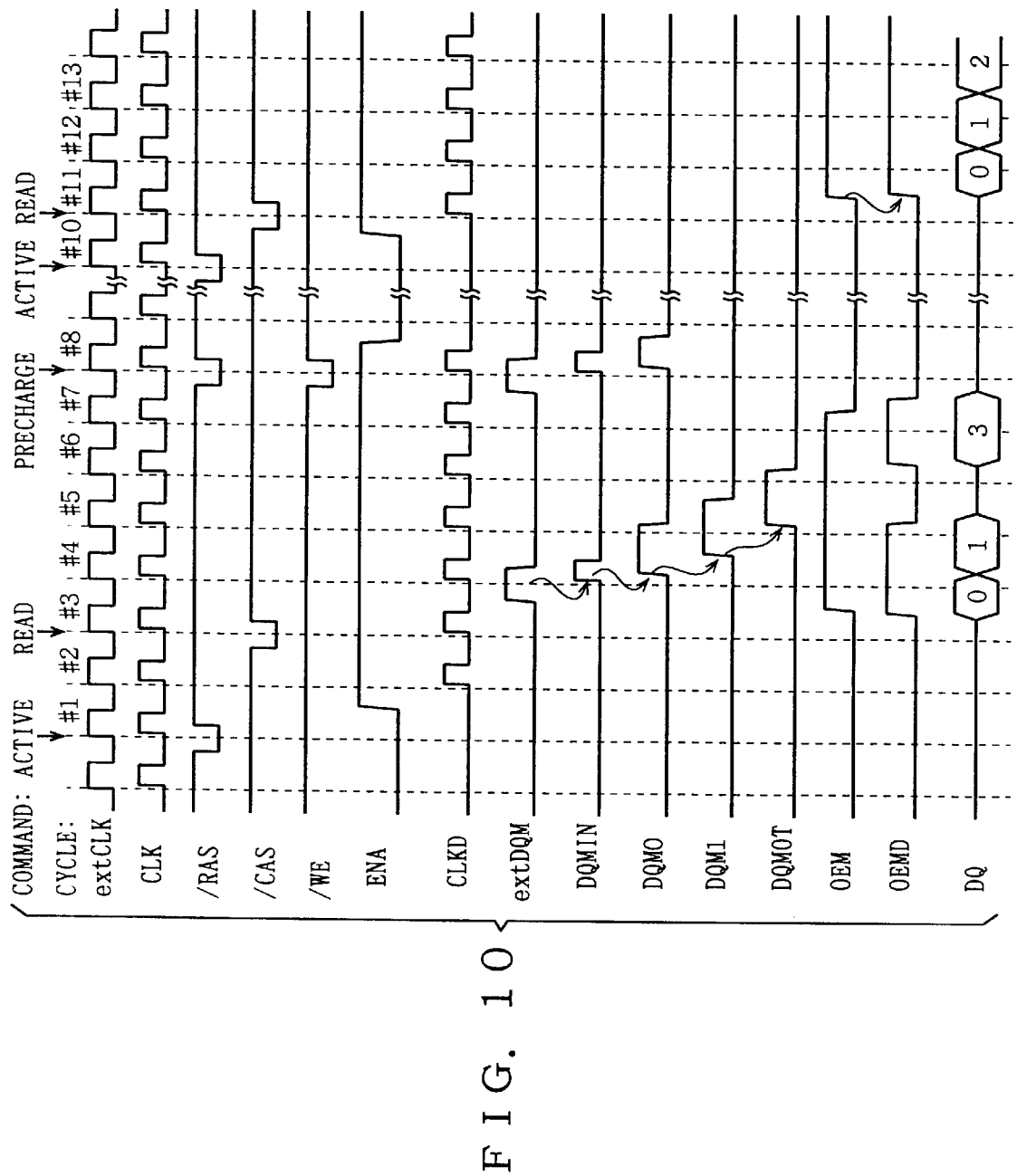
FIG. 10 is a timing chart representing the operation of the synchronous semiconductor memory device shown in FIG. 1.

If the data is masked in the data reading, output enable signal OEMD attains L level, MOS transistors 6bd and 6be are turned off, and output buffer 6b is brought into an output high impedance state. The operation of a data output portion in FIGS. 7 to 9 will now be described with reference to a timing chart shown in FIG. 10. FIG. 10 exemplifies a data read operation sequence when the CAS latency is one and a burst length is four.

When an active command is applied in clock cycle #1, column related clock activation signal ENA is brought into the active state at H level in clock cycle #1, and column related internal clock signal CLKD is produced starting from clock cycle #2. This allows shift operation by mask control circuit 25 shown in FIG. 7. Mask designation signal DQMIN as well as signals DQMO, DQM1 and DQMOT from mask control circuit 25 are all at L level.

When a read command is applied in clock cycle #3, column selection operation is internally performed and data is read out in clock cycles #4 and #5. When external mask designation signal extDQM is set in the active state at H level in clock cycle #4, mask designation signal DQMIN is maintained at H level for a prescribed period of time. Responsively, in mask control circuit 25 shown in FIG. 7, initial stage shift circuit 25a incorporates mask designation signal DQMIN at H level and signal DQMO attains H level. Shift circuit 25b incorporates signal DQMO in response to the fall of internal clock signal CLK0 in clock cycle #4, and its output signal DQM1 rises to H level. Data output activation signal OEM has risen to H level in clock cycle #3 in which the read command was applied due to the CAS latency of one.

Next, in clock cycle #5, shift circuit 25c incorporates signal DQM1 in response to the rise of column related internal clock signal CLKD, and responsively internal mask designation signal DQMOT is maintained at H level for one clock cycle. As a result, output enable signal OEMD from the output control circuit shown in FIG. 8 falls to L level, and the output buffer shown in FIG. 9 is brought into the output high impedance state, so that its data output is prohibited.

Then, in clock cycle #6, internal mask designation signal DQMOT is again brought into the inactive state at L level, and a final data ("3") of the burst length data is read out in clock cycle #7.

When a precharge command is applied in clock cycle #8, column related clock activation signal ENA is brought into the inactive state at L level. In clock cycle #8, to ensure that unnecessary reading of data is prohibited, external mask designation signal extDQM is set in the active state at H level, and responsively mask designation signal DQMIN attains H level. Shift circuit 25a shown in FIG. 7 incorporates mask designation signal DQMIN at H level, and drives signal DQMO at H level. However, column related clock activation signal ENA is driven into the inactive state at L level, each of these shift circuits 25a to 25c (with reference to FIG. 7) is reset, signal DQMO again attains L level, transmission of signal DQMIN at H level is prohibited, and signals DQMO, DQM1 and DQMOT are all reset at L level. When column related clock activation signal ENA is brought into the inactive state at L level, generation of column related internal clock signal CLKD is stopped, and therefore mask control circuit 25 does not perform its shift operation for that period of time.

The active command is again applied in a clock cycle #10, for activation of the array. Next, the read command is applied in a clock cycle #11. At the time, in mask control circuit 25 shown in FIG. 7, each of signals DQMO, DQM1 and DQMOT is reset at L level, and therefore when data output activation signal OEM is brought into the active state at H level in clock cycle #11, output enable signal OEMD from the output control circuit shown in FIG. 8 is responsively brought into the active state, output buffer 6b shown in FIG. 9 is enabled, and reading of the selected memory cell data is performed. Therefore, even if external mask designation signal extDQM is set in the active state before the column related internal clock signal is stopped, it is ensured that every output signal from mask control circuit 25 is reset in the inactive state when generation of the column related internal clock signal is stopped. Also, when reading operation is restarted, mask control circuit 25 can perform correct data reading as it starts the operation in the initial state.

It is noted that mask control circuit 25 is reset when column related clock activation signal ENA is in the inactive state. This is because if external mask designation signal extDQM is set in the active state when data reading is not necessary, there may be a case where external mask designation signal extDQM is retained in the active state also upon activation of column related clock activation signal ENA, and reset for such mask has to be prevented. When generation of column related internal clock signal is stopped, reading of data is not performed, so that masking is not especially required. Also in a system in which external mask designation signal extDQM is set in the active state when data reading is not necessary, when generation of column related internal clock signal CLKD is stopped, data output activation signal OEM is in the inactive state, the output buffer is in the output high impedance state and the read out data is internally automatically masked.

As described above, according to the first embodiment of the present invention, the mask control circuit for masking data output in the synchronous semiconductor memory device is structured such that it is reset into the initial state when the column related circuit does not operate, so that the mask control circuit can stop its operation when the column related circuit operation is stopped, thereby reducing current consumption without accompanying any malfunction.

Second Embodiment

Figure 11A:
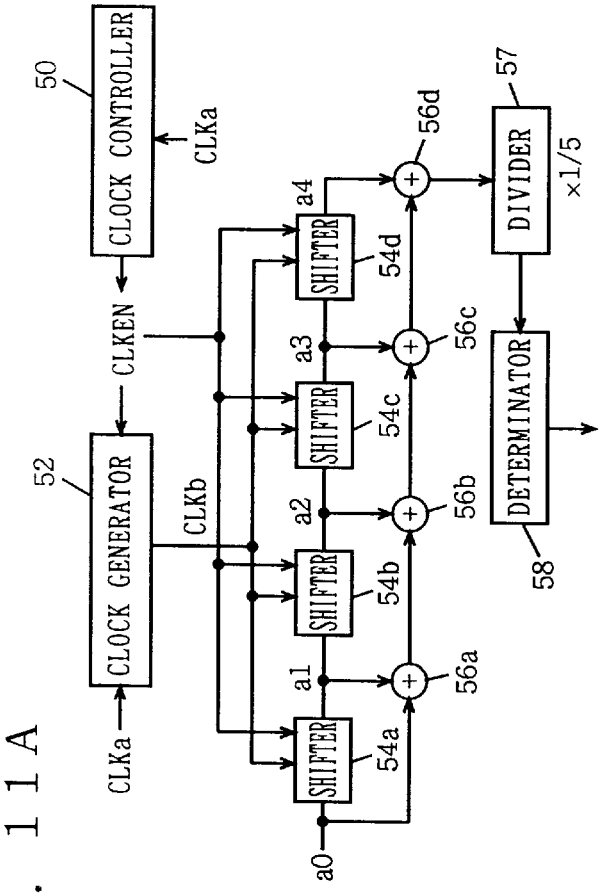
FIG. 11A schematically shows an arrangement of a system circuit apparatus using a clock shift circuit in accordance with a second embodiment of the present invention.

FIG. 11A schematically shows an arrangement, of a system employing a clock shift circuit in accordance with a second embodiment of the present invention. Referring to FIG. 11A, the clock shift circuit device includes a clock generator 52 activated in response to a clock activation signal CLKEN from a clock controller 50, to produce a shift clock signal CLKb in synchronization with an internal clock signal CLKa. Cascaded four stage shifters 54a to 54d perform shift operation of data in accordance with shift clock CLKb from clock generator 52. Shifters 54a to 54d are reset into the initial state upon inactivation of clock activation signal CLKEN. Adders 56a to 56d are provided corresponding to shifters 54a to 54d, respectively. Adder 56a performs addition of an output signal a1 and an input data signal a0. Adder 56b adds an output data signal a2 from shifter 54b to an addition result signal from adder 56a.

Figure 11B:
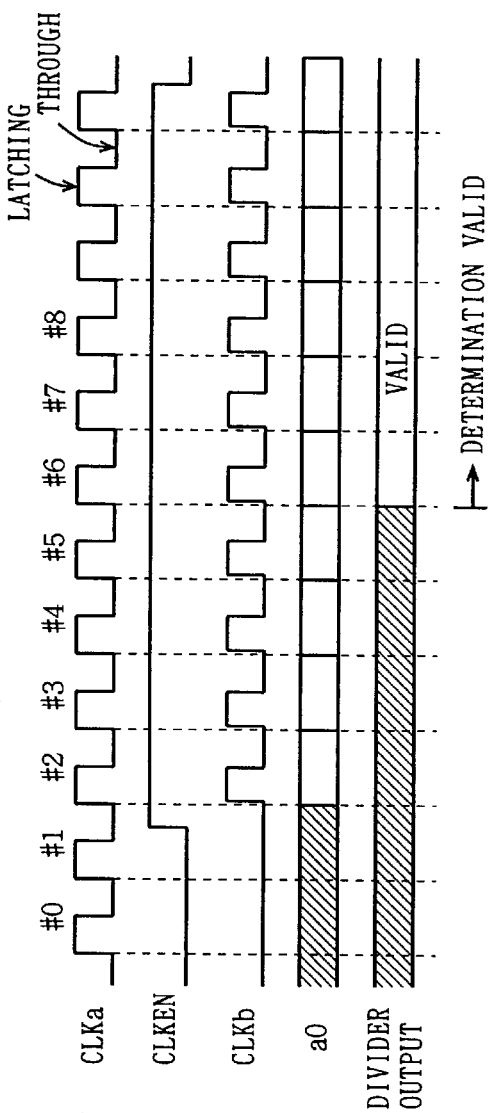
FIG. 11B is a timing chart representing the operation thereof.
Figure 13:
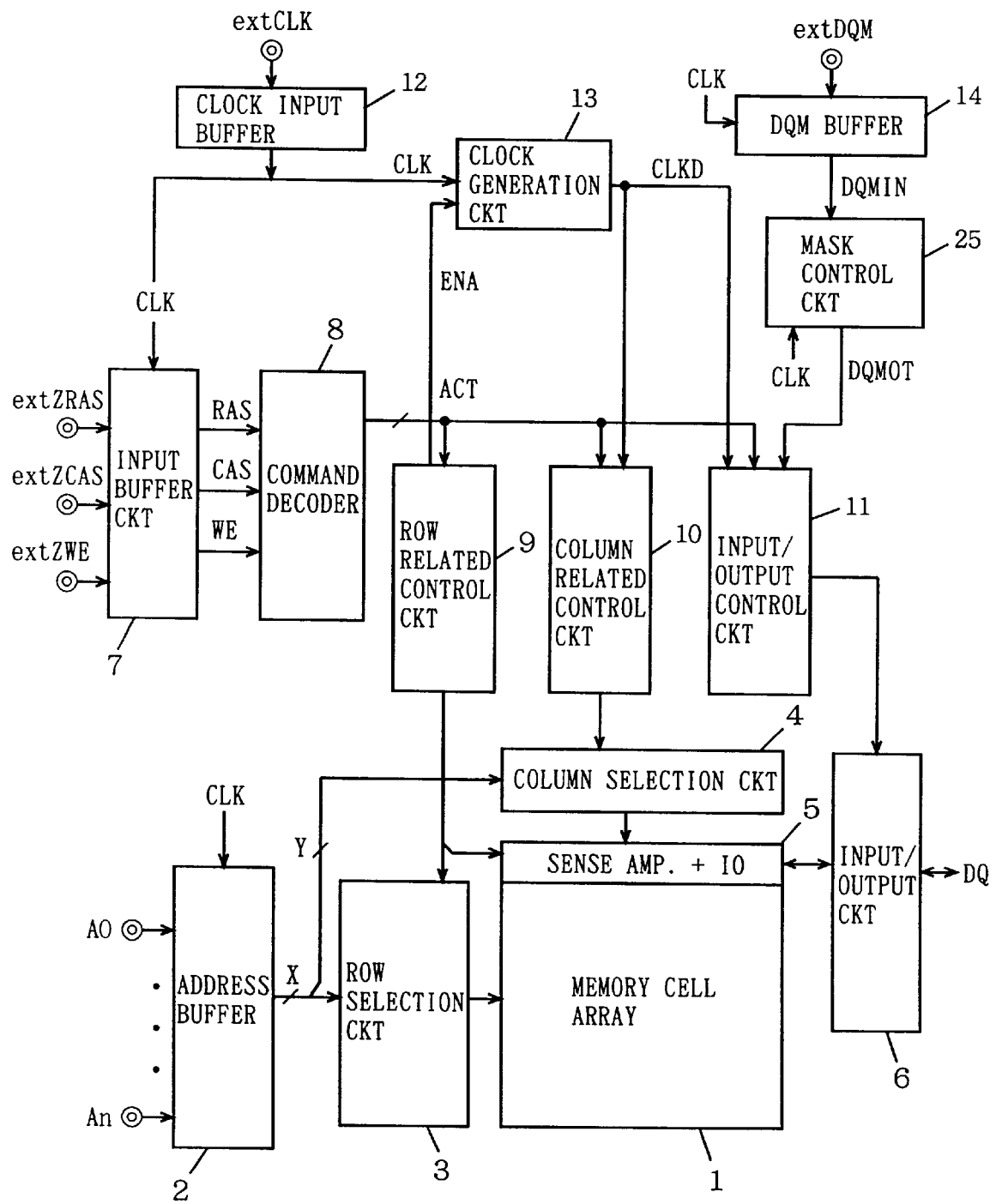
FIG. 13 schematically shows an overall arrangement of a conventional synchronous semiconductor memory device.

Adder 56c adds an output data signal a3 from shifter 54c to an output data signal a3 from adder 56b. Adder 56d adds an output data signal a4 from shifter 54d to an addition result signal from adder 56c. An output signal from adder 56d is applied to a divider 57. Divider 57 divides the addition result from adder 56d by a factor of five. In other words, data representing a value of (a0+a1+a2+a3+a4)/5 is output from divider 57. A determinator 58 determines if the division result obtained from divider 57 satisfies a prescribed condition, and outputs a signal representing the determination result. Assume that determinator 58 determines that there is abnormality in the system outputting data a0 when the division value represented by the signal from divider 57 is larger (or smaller) than a prescribed value. Next, the operation of the system using the clock shift circuit shown in FIG. 11A will be described with reference to a timing chart shown in FIG. 11B.

In a clock cycle #0, a clock activation signal CLKEN is in the inactive state at L level, and a clock signal CLKb for shifting is fixed at L level. In this state, a value of input data signal a0 is "don't care". In a clock cycle #1, clock activation signal CLKEN is generated from clock controller 50, and a clock generator 52 generates shift clock signal CLKb starting from clock cycle #2. Assume that when clock signal CLKb for shifting is at H level, shifters 54a to 54d are in a latching state, and when shift clock signal CLKb is at L level, shifters 54a to 54d are set in a through state in which applied data is incorporated, latched and output to a subsequent stage.

In clock cycle #2, when clock signal CLKb for shifting rises, data signal a0 is simply applied, output data signals a1 to a4 from shifters 54a to 54d are invalid data signals, and an output signal from divider 57 is also invalid. In a clock cycle #3, an initial input data signal is shifted by one stage. Output data signal a1 from shifter 54a is brought into a valid state. The remaining data signals a2 to a4 are however invalid data.

If shift operation is performed in each of clock cycles #3, #4 and #5, in a clock cycle #6, data signals a0, a1, a2, a3 and a4 are all data signals applied after clock activation signal CLKEN is brought into the active state. Thus, an output signal from divider 57 becomes valid from clock cycle #6. In clock cycles #2 through #5, determinator 58 determines there is abnormality in the input data signal when a value of the output signal from divider 57 is equal to or higher than a prescribed value. However, shifters 54a to 54d are set in the initial state in which the system generating input data a0 is free from abnormality, upon activation of clock activation signal CLKEN, and therefore wrong determination is not produced from determinator 58. Correct determination operation in accordance with the input data signal is performed starting from clock cycle #6.

As shown in FIG. 11A, in the system in which shift clock signal CLKb is applied in accordance with clock activation signal CLKEN only for a desired period of time, such a structure is not necessary as to inhibit the determination operation of determinator 58 until the output signal from divider 57 becomes valid, and therefore abnormality/normality of the system can be correctly determined.

Figure 12:
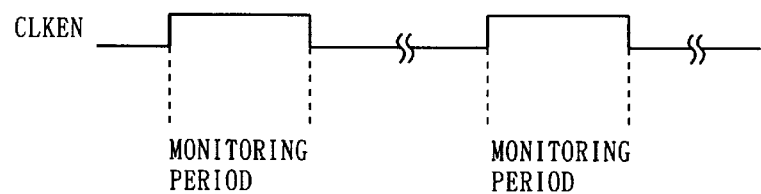
FIG. 12 is a diagram showing the operation manner of the circuit device shown in FIG. 11A.

Thus, as shown for example in FIG. 12, also in a structure in which input data signal a0 is an output signal from a sensor, clock activation signal CLKEN is activated at an interval of a prescribed period of time to monitor a sensor output for determining abnormality/normality of the system, abnormality/normality of the system can be correctly determined.

It is noted that the above described second embodiment employs divider 57 to determine abnormality/normality of the system using an average value over a period of clock cycles of the input data signal. Alternatively, a structure may be used in which a divider is not employed and determination is made on if there is any abnormality in the system in accordance with a value of the output signal from adder 56*d*.

In the above described FIG. 11A, a structure taking a so-called "moving average" is employed. However, in a case of a structure in which the sensor output is filtered by a digital filter and abnormality/normality in the system is determined in accordance with the result obtained from the filtering, for example, such a digital filter similarly functions as a shift circuit because a delay circuit therein operates in synchronization with a clock signal. Therefore, in a case in which a sensor output is filtered by a digital filter and abnormality/normality in the system is determined by intermittently monitoring the filtered output at a prescribed time interval, a similar effect can be obtained.

Moreover, the circuit device of FIG. 11A may be structured such that a process to be executed is selected in accordance with an output signal from determinator 58, rather than determining abnormality/normality in the system.

In addition, the present invention is applicable to any clock shift circuit in which a clock signal for shifting is applied for a desired period of time for shift operation. The present invention can also be applied, for example, to a circuit device in which a prescribed processing is performed in accordance with logic coincidence/incoincidence of input data signal a0 and output data signal a4 in a final stage in shifters 54*a* to 54*d* when clock activation signal CLKEN is brought into the active state.

Moreover, in the first embodiment of the present invention, the synchronous semiconductor memory device is used which incorporates an external control signal at the rising edge of the clock signal for data reading. However, the present invention is also applicable to a synchronous semiconductor memory device for inputting/outputting data using both of rising and falling edges of the clock signal.

As in the foregoing, according to the present invention, in the clock shift circuit which incorporates a clock signal as needed for shift operation, the internal portion of the clock shift circuit is reset into the initial state in accordance with inactivation of the clock activation signal which defines a clock application period when the clock signal is not applied. Therefore, even when shift operation is restarted, malfunction caused by the output signal from the clock shift circuit can be prevented, and current consumption can be reduced as the circuit operates only as needed.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A synchronous semiconductor memory device comprising:

read and output circuitry responsive to a data read instruction applied in synchronization with a clock signal for reading out and externally outputting data in a selected memory cell in synchronization with an internal clock signal;

internal mask generation circuitry receiving a mask instruction for masking a data output from said read and output circuitry and for performing a shift operation in synchronization with said internal clock signal to generate an internal mask instruction;

internal clock generation circuitry response to activation of a clock activation signal for generating said internal clock signal in synchronization with said clock signal for application to said read and output circuitry and said internal mask generation circuitry;

mask circuitry responsive to activation of said internal mask instruction for stopping external data output from said read and output circuitry; and reset circuitry responsive to inactivation of said clock activation signal for resetting said internal mask generation circuitry.

2. The synchronous semiconductor memory device according to claim 1, wherein said read/output circuitry includes read activation circuit responsive to a data read instruction applied in synchronization with said clock signal for driving an output enable signal into an active state for a prescribed period of time, and output circuit activated upon activation of said output enable signal for externally outputting internal read data applied in synchronization with said internal clock signal;

said mask circuitry include a component responsive to activation of the internal mask instruction from said internal mask generation circuitry, for inactivating said output enable signal; and said reset circuitry includes a reset component responsive to inactivation of said clock activation signal for resetting said internal mask generation circuitry into an initial state, the internal mask instruction from the internal mask generation circuitry being at an inactive state in said initial state.

3. The synchronous semiconductor memory device according to claim 1, wherein said internal mask generation circuitry includes a circuit incorporating and shifting said mask instruction in synchronization with said internal clock signal for generating said internal mask instruction.

4. The synchronous semiconductor memory device according to claim 1, wherein said internal mask generation circuitry includes shift circuitry for performing shift operation on the mask instruction incorporated in synchronization with said internal clock signal for a prescribed cycle period of said internal clock signal to generate said internal mask instruction.

5. The synchronous semiconductor memory device according to claim 4, wherein said reset circuitry includes a component for resetting an output from each shift stage of said shift circuitry.

6. The synchronous semiconductor memory device according to claim 1, wherein said clock activation signal is activated from application of an array activation instruction for placing the semiconductor memory device into a selected state till an elapse of a predetermined number of cycles of said clock signal after application of said data read instruction.

7. A clock shift circuit device, comprising:

clock generation circuitry responsive to a clock activation signal for generating a clock signal;

shift circuitry incorporating and shifting an applied signal in synchronization with the clock signal from said clock generation circuitry for output;

process circuitry performing a prescribed process in accordance with a signal output from said shift circuitry; and reset circuitry responsive to inactivation of said clock activation signal for resetting said shift circuitry into an initial state.

8. The clock shift circuit according to claim 7, wherein said applied signal instructs a masking on outputting of a data read from a selected memory cell, and said process circuitry includes a control circuit for inactivating an output enable signal applied to an output circuit for externally outputting the data of the selected memory cell in response to the signal received from the shift circuitry being active to instruct the masking.

9. A clock shift circuit performing a shift operation in synchronization with a clock signal generated upon activation of a clock activation signal, comprising:

shifter incorporating and shifting an applied signal in synchronization with the clock signal; and resetter responsive to inactivation of said clock activation signal for resetting said shifter into an initial state.

10. The clock shift circuit according to claim 9, wherein said applied signal instructs a masking on outputting of data of a selected memory cell.

* * * * *